United States Patent
Aoki

(10) Patent No.: US 9,741,540 B2
(45) Date of Patent: Aug. 22, 2017

(54) METHOD FOR SURFACE TREATMENT OF UPPER ELECTRODE, PLASMA PROCESSING APPARATUS AND UPPER ELECTRODE

(71) Applicant: TOKYO ELECTRON LIMITED, Tokyo (JP)

(72) Inventor: Yusuke Aoki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/130,188

(22) Filed: Apr. 15, 2016

(65) Prior Publication Data

US 2016/0307741 A1 Oct. 20, 2016

(30) Foreign Application Priority Data

Apr. 20, 2015 (JP) .................... 2015-086200

(51) Int. Cl.
*H01J 37/32* (2006.01)
*H01L 21/67* (2006.01)

(52) U.S. Cl.
CPC .. *H01J 37/32091* (2013.01); *H01J 37/32532* (2013.01); *H01J 37/32559* (2013.01); *H01J 37/32862* (2013.01)

(58) Field of Classification Search
None
See application file for complete search history.

(56) References Cited

U.S. PATENT DOCUMENTS

| 6,451,703 | B1 * | 9/2002 | Liu | H01L 21/76802 |
| | | | | 257/E21.252 |
| 6,506,254 | B1 * | 1/2003 | Bosch | H01J 37/32477 |
| | | | | 118/715 |
| 6,890,861 | B1 * | 5/2005 | Bosch | C04B 41/0054 |
| | | | | 427/534 |
| 7,481,230 | B2 * | 1/2009 | Sakima | H01J 37/32862 |
| | | | | 134/1.1 |
| 8,282,734 | B2 * | 10/2012 | Padhi | C23C 16/0254 |
| | | | | 118/45 |
| 8,778,810 | B2 * | 7/2014 | Takaba | C23C 16/0272 |
| | | | | 438/761 |

(Continued)

FOREIGN PATENT DOCUMENTS

JP 2001-85405 A 3/2001

*Primary Examiner* — Allan Olsen
(74) *Attorney, Agent, or Firm* — Rothwell, Figg, Ernst & Manbeck, P.C.

(57) ABSTRACT

In a method for surface treatment of an upper electrode, a first step is performed to roughen a facing surface of the upper electrode facing a lower electrode while depositing a CF-based deposit on the facing surface by using a plasma of a processing gas by supplying a first and second high frequency powers to the lower and upper electrode. A second step is performed to remove a part of the CF-based deposit by using a plasma of a processing gas by supplying the second high frequency power to the upper electrode only, and a third step is performed to remove the CF-based deposit remaining in the second step by using a plasma of a processing gas by supplying the first and second high frequency powers to the lower and upper electrode. Further, the first, second and third steps are repeated multiple times.

8 Claims, 6 Drawing Sheets

(56) References Cited

U.S. PATENT DOCUMENTS

| | | | |
|---|---|---|---|
| 2006/0144819 A1* | 7/2006 | Sawin | C23C 16/4405 216/63 |
| 2007/0202340 A1* | 8/2007 | Tamitsuji | B05D 1/62 428/421 |
| 2009/0047447 A1* | 2/2009 | Sawin | B08B 7/0035 427/575 |
| 2016/0307741 A1* | 10/2016 | Aoki | H01J 37/32091 |
| 2016/0343579 A1* | 11/2016 | Peng | C09K 13/00 |

* cited by examiner

METHOD FOR SURFACE TREATMENT OF UPPER ELECTRODE, PLASMA PROCESSING APPARATUS AND UPPER ELECTRODE

CROSS-REFERENCE TO RELATED APPLICATIONS

This application claims priority to Japanese Patent Application No. 2015-086200 filed on Apr. 20, 2015, the entire contents of which are incorporated herein by reference.

FIELD OF THE INVENTION

The disclosure relates to a method for surface treatment of an upper electrode, a plasma processing apparatus, and the upper electrode.

BACKGROUND OF THE INVENTION

In a semiconductor manufacturing process, a plasma processing apparatus for performing a plasma processing for the purpose of, e.g., a thin film deposition, an etching or the like is widely used. The plasma processing apparatus may be configured as, e.g., a plasma CVD (Chemical Vapor Deposition) apparatus for performing thin film deposition, a plasma etching apparatus for performing an etching process, or the like.

The plasma processing apparatus includes a processing chamber for defining a plasma processing space, a gas supply system for introducing a processing gas required for plasma reaction into the processing chamber, and the like. Further, the plasma processing apparatus includes a lower electrode provided in the processing space and configured to mount thereon a target object to be processed, an upper electrode provided in the processing chamber to face the lower electrode, and the like.

In the plasma processing apparatus, it is known that an etching rate of a target substrate to be processed in the case of using a new upper electrode installed in the plasma processing apparatus is different from an etching rate of a target substrate to be processed in the case of using a used upper electrode. This is because a surface of the new upper electrode, which has not yet been exposed to a plasma, has a lower surface roughness compared to that of the used upper electrode. This makes a state of a plasma generated by using the new upper electrode different from a state of a plasma generated by using the used upper electrode.

In order to suppress the etching rate variation, there is used a technique for detaching an upper electrode from the plasma processing apparatus and roughening a surface of the upper electrode by performing surface treatment such as a wet etching, a sandblasting or the like (see, e.g., Japanese Patent Application Publication No. 2001-85405).

However, the conventional technique is disadvantageous in that the operation of detaching the upper electrode may deteriorates the operation efficiency of the plasma processing apparatus. Therefore, it is desired to roughen the surface of the upper electrode without the detaching operation.

SUMMARY OF THE INVENTION

In accordance with an aspect, there is provided a method for surface treatment of an upper electrode, including: a first step of roughening a facing surface of the upper electrode facing a lower electrode while depositing a CF-based deposit on the facing surface by using a plasma of a processing gas containing a CF-based gas, $O_2$ gas and Ar gas by respectively supplying a first and a second high frequency power to the lower electrode and the upper electrode; a second step of removing a part of the CF-based deposit from the facing surface by using a plasma of a processing gas containing $O_2$ gas by supplying the second high frequency power to the upper electrode only; and a third step of removing the CF-based deposit remaining in the second step from the facing surface by using a plasma of a processing gas containing $O_2$ gas by respectively supplying the first and the second high frequency power to the lower electrode and the upper electrode. Further, the first, second and third steps are repeated multiple times.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
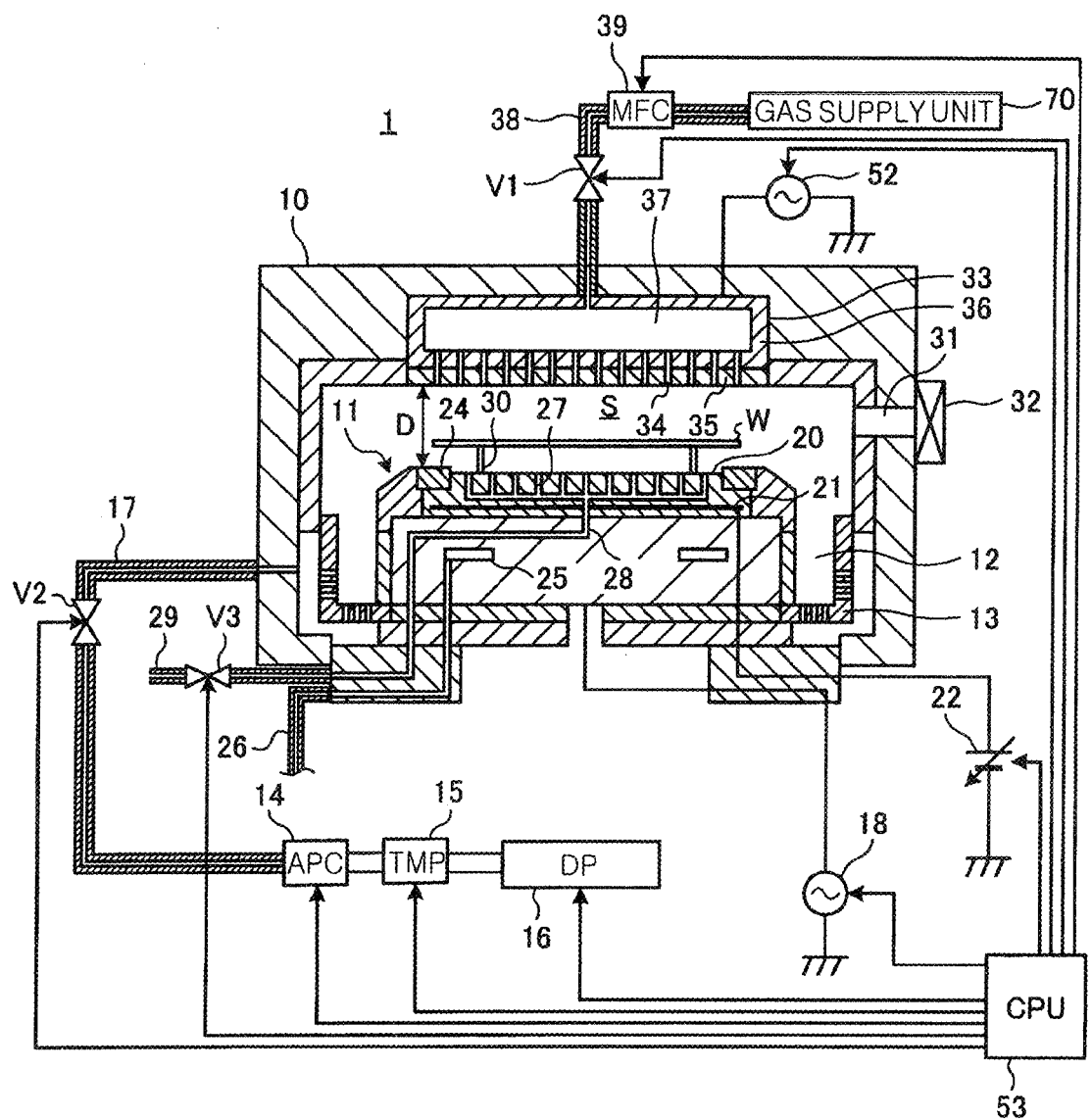
FIG. 1 is a cross sectional view schematically showing a configuration of a plasma processing apparatus according to an embodiment.

Hereinafter, exemplary embodiments of a method for surface treatment of an upper electrode, a plasma processing apparatus, and an upper electrode will be described in detail with reference to the accompanying drawings. Like reference numerals will be given to like or corresponding parts throughout the respective drawings.

FIG. 1 is a cross sectional view schematically showing a configuration of a plasma processing apparatus according to an embodiment.

Referring to FIG. 1, a plasma processing apparatus 1 is configured as an etching apparatus to perform an etching process on a wafer W and includes a cylindrical processing chamber 10 made of a metal, e.g., aluminum or stainless steel. A cylindrical susceptor 11 is provided in the processing chamber 10. The susceptor 11 serves as a lower electrode to mount thereon the wafer W which is a target substrate to be processed.

Formed between an inner surface of a sidewall of the processing chamber 10 and a side surface of the susceptor 11 is a gas exhaust passageway 12 serving as a flow path for discharging gas from a space above the susceptor 11 to the outside of the processing chamber 10. An annular baffle plate 13 is disposed in the gas exhaust passageway 12. A space at a downstream side of the gas exhaust passageway 12 below the baffle plate 13 is connected to an automatic pressure control (hereinafter, referred to as "APC") valve 14 employed as a variable butterfly valve. The APC 14 is connected at a downstream side thereof to a turbo molecular pump (hereinafter, referred to as "TMP") employed as a gas exhaust pump for vacuum suction and, further, connected to a dry pump (hereinafter, referred to as "DP") employed as a gas exhaust pump through the TMP 15. A gas exhaust channel formed by the APC 14, the TMP 15 and the DP 16 is referred to as "main gas exhaust line", which performs a pressure control in the processing chamber 10 by using the APC 14 and depressurizes the inside of the processing chamber 10 to an approximate vacuum state by using the TMP 15 and the DP 16. The APC 14, the TMP 15 and the DP 16 are examples of a gas exhaust unit for depressurizing the inside of the processing chamber 10.

The aforementioned space in the gas exhaust passageway at the downstream side of the baffle plate 13 communicates with another gas exhaust channel (hereinafter, referred to as "rough pumping line"), different from the main gas exhaust line. When the inside of the processing chamber is vacuum-sucked, a gas in the processing chamber 10 is discharged by the DP 16 through the rough pumping line.

A high frequency power supply 18 is connected to the susceptor 11 to supply to the susceptor 11 a predetermined high frequency bias power for attracting ions to the wafer W. The high frequency power supply 18 outputs a high frequency power of a predetermined frequency ranging from 400 kHz to 20 MHz, e.g., 13.56 MHz.

At an upper portion of the susceptor 11, there is disposed an electrostatic chuck 20 for attracting and holding the wafer W by an electrostatic attraction force. The electrostatic chuck 20 has therein an electrode 21 made of, e.g., a conductive film embedded between insulating layers. A DC power supply 22 is electrically connected to the electrode 21. The wafer W is attracted and held on a top surface of the susceptor 11 by the electrostatic attraction force such as Johnson-Rahbek force or Coulomb force generated by a DC voltage applied from the DC power supply 22 to the electrostatic chuck 20. When no wafer W is attracted and held on the top surface of the susceptor 11, the electrostatic chuck 20 is electrically disconnected from the DC power supply 22 and becomes in a floating state. An annular focus ring 24 made of, e.g., silicon (Si), is disposed to surround the electrostatic chuck 20 and functions to converge a plasma generated above the susceptor 11 toward the wafer W.

The susceptor 11 has therein an annular coolant path extending in, e.g., a circumferential direction. A coolant, e.g., cooling water, of a predetermined temperature is supplied from a chiller unit (not shown) to the coolant path 25 through a line 26. Therefore, a processing temperature of the wafer W on the susceptor 11 is controlled by the temperature of the coolant.

A plurality of heat transfer gas supply holes 27 and heat transfer gas supply grooves (not shown) are formed at a portion of the top surface of the susceptor 11 where the wafer W is attracted and held (hereinafter, referred to as "wafer mounting surface"). A heat transfer gas, e.g., He gas, is supplied from a heat transfer gas supply unit (not shown) to a gap between the wafer mounting surface and a backside surface of the wafer W through a heat transfer gas supply line 28 provided in the susceptor 11. Accordingly, thermal conductivity between the wafer W and the susceptor 11 is improved. Further, a valve V3 is provided to allow and block communication between the heat transfer gas supply holes 27 and the heat transfer gas supply unit.

At the wafer mounting surface of the susceptor 11, there is provided a plurality of pusher pins 30 serving as lift pins, which can protrude beyond and retract below the top surface of the electrostatic chuck 20. The pusher pins are moved up and down in FIG. 1 by converting a rotational movement of a motor (not shown) to a linear movement by a ball screw or the like. While the wafer W is attracted and held on the wafer mounting surface, the pusher pins 30 are accommodated in the susceptor 11. On the other hand, when the processed wafer W is unloaded from the processing chamber 10, the pusher pins 30 protrudes beyond the top surface of the electrostatic chuck 20 to lift the wafer W upward. Then, the wafer W is unloaded from the processing chamber through the gate valve 32.

An upper electrode 33 is disposed above the susceptor (the lower electrode) to face the susceptor 11. A high frequency power supply 52 is connected to the upper electrode 33. The high frequency power supply 52 supplies a predetermined high frequency power to the upper electrode 33, so that a plasma is generated in a space between the upper electrode 33 and the susceptor 11. The high frequency power supply 52 outputs a high frequency power of a frequency ranging from 27 MHz to 100 MHz, e.g., 60 MHz.

The upper electrode 33 includes an electrode plate 35 having a plurality of gas injection holes 34 and an electrode holder 36 for detachably holding the electrode plate 35. The electrode holder 36 is made of a conductive material, e.g., aluminum having an anodically oxidized surface. The electrode plate 35 is made of a Si-containing material, e.g., single crystalline silicon, quartz ($SiO_2$) or the like. Further, the electrode plate 35 is disposed to face the susceptor 11. In other words, the electrode plate 35 of the upper electrode 33 has a surface facing the susceptor 11.

A buffer space 37 is provided in the electrode holder 36. A processing gas inlet line 38 from a processing gas supply unit 70 is connected to the buffer space 37. A valve V1 is installed in the processing gas inlet line 38 to allow and block communication between the buffer space 37 and the processing gas supply unit 70.

A mass flow controller (MFC) 39 is installed at an upstream side of the valve V1 in the processing gas inlet line 38 to control a flow rate of a processing gas introduced into the processing chamber 10. The mass flow controller 39 is electrically connected to a central processing unit (CPU) 53 to be described later and controls flow rates of the purge gas and the processing gas introduced into the processing chamber 10 based on the signal from the CPU 53.

A gate valve 32 for opening or closing the loading/unloading port 31 of the wafer W is installed at the sidewall of the processing chamber 10.

In the processing chamber 10 of the plasma processing apparatus 1, as described above, high frequency powers are applied to the susceptor 11 and the upper electrode 33, so that the processing gas is converted into a high-density plasma in the space S, and therefore, ions or radicals are generated.

Further, the plasma processing apparatus 1 includes the CPU 53 provided inside or outside thereof. The CPU 53 is connected to the respective components such as the valves V1 to V3, the APC 14, the TMP 15, the DP 16, the high frequency power supplies 18 and 52, the mass flow controller 39, the DC power supply 22 and the like. Further, the CPU 53 controls operations of the respective components based on a user's command or a predetermined processing recipe. The CPU 53 is an example of a control unit.

For example, the CPU 53 controls the respective components of the plasma processing apparatus 1 such that the surface treatment of the upper electrode 33 which will be described later is carried out. Specifically, the CPU 53 executes a first step of roughening a facing surface of the upper electrode 33 which faces the susceptor 11 while depositing a CF-based deposit on the facing surface by using a processing gas containing the CF-based gas, $O_2$ gas and Ar gas by respectively supplying the high frequency powers to the susceptor 11 and the upper electrode 33. Further, the CPU 53 executes a second step of removing a part of the CF-based deposit from the facing surface of the upper electrode by using a plasma of a processing gas containing $O_2$ gas by supplying the high frequency power to the upper electrode 33 only. Moreover, the CPU 53 executes a third step of removing the CF-based deposit remaining on the facing surface of the upper electrode 33 by using the plasma of the processing gas containing $O_2$ gas by respectively supplying the high frequency powers to the susceptor 11 and the upper electrode 33. The CPU 53 also executes a control step to perform multiple repetition of the first, second and third steps.

Figure 2:
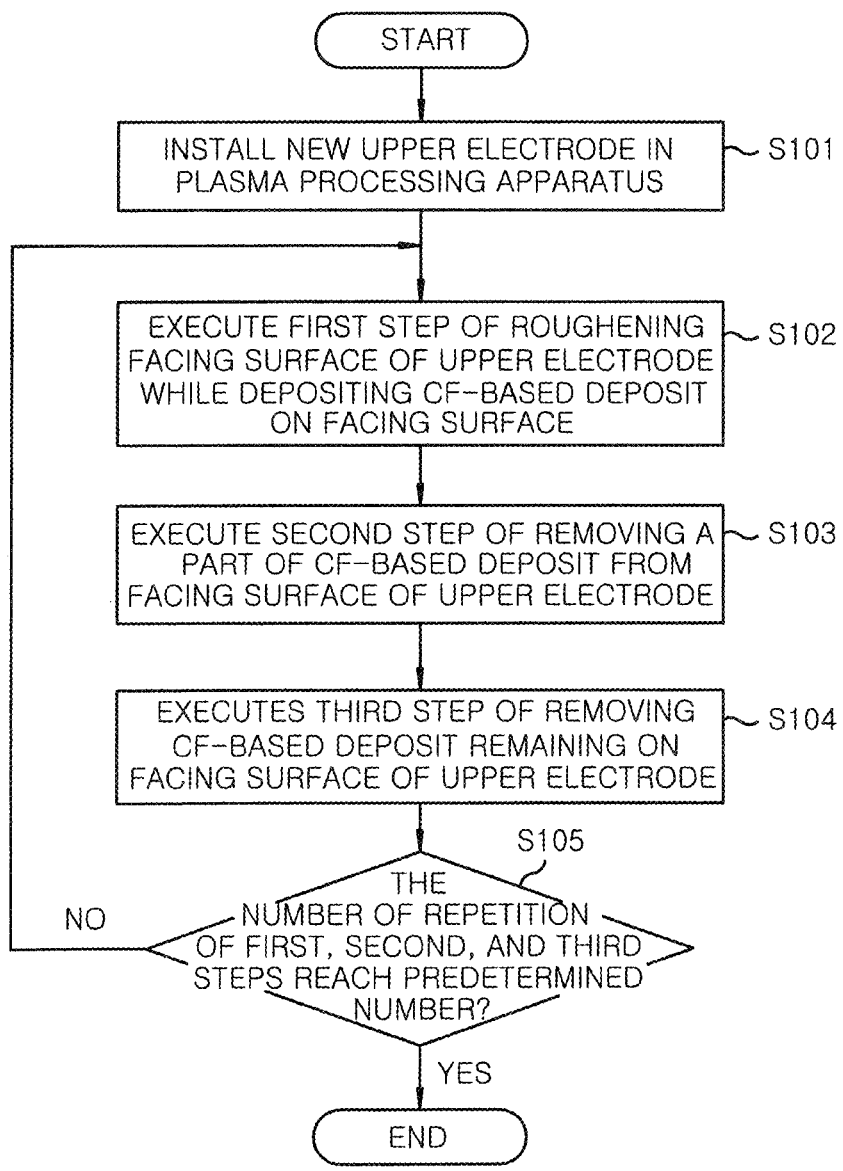
FIG. 2 is a flowchart showing an exemplary sequence of surface treatment of an upper electrode according to an embodiment.

Next, there will be described respective steps in the method for the surface treatment of the upper electrode 22, which is carried out by the plasma processing apparatus 1 according to the embodiment. FIG. 2 is a flowchart showing an exemplary sequence of the surface treatment of the upper electrode according to the embodiment. FIGS. 3A to 3D explain the respective steps for the surface treatment of the upper electrode according to the embodiment. In the description of FIGS. 3A to 3D, the electrode plate 35 of the upper electrode 33 is comprehensively referred to as "upper electrode 33" and the facing surface of the electrode plate 35 of the upper electrode 33 which faces the susceptor 11 is comprehensively referred to as "facing surface 33a".

Figure 3:
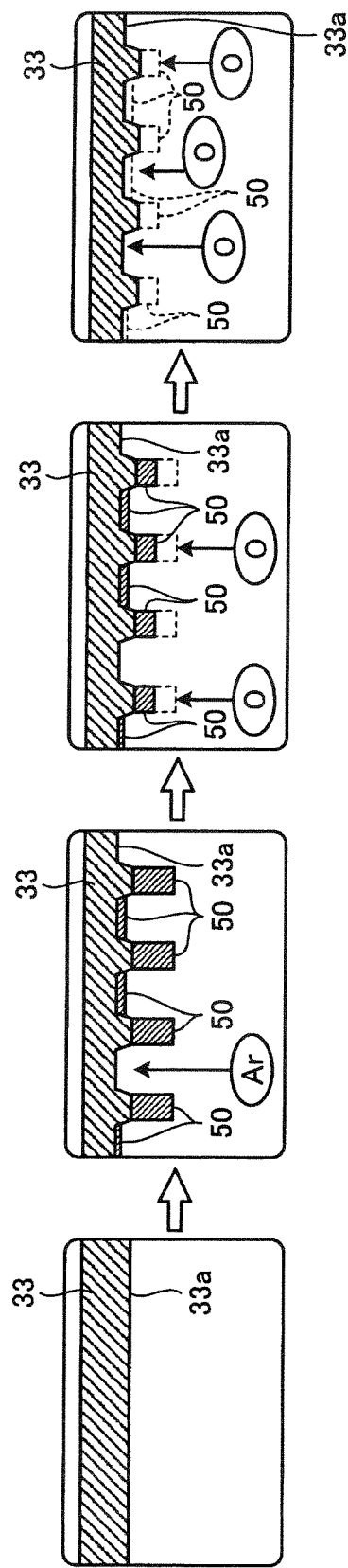
FIGS. 3A to 3D explain respective steps for the surface treatment of the upper electrode according to the embodiment.

In the method for the surface treatment of the upper electrode 33 according to the embodiment, first, a new upper electrode 33 is installed in the plasma processing apparatus 1 (step S101). In this step, the facing surface 33a of the upper electrode 33 is flat as shown in FIG. 3A.

Next, the CPU 53 executes the first step of roughening the facing surface 33a of the upper electrode 33 while depositing a CF-based deposit on the facing surface 33a by using a plasma of a processing gas containing a CF-based gas, $O_2$ gas and Ar gas by respectively supplying high frequency powers to the susceptor 11 and the upper electrode 33 (step S102). Here, the CF-based gas is, e.g., $C_4F_6$ gas.

The first step will be described in detail hereinafter. The CPU 53 executes a supply of the processing gas containing the CF-based gas, the $O_2$ gas and the Ar gas into the processing chamber 10 from the processing gas supply unit 70. Next, the CPU 53 executes a generation of the plasma of the processing gas containing the CF-based gas, the $O_2$ gas and the Ar gas by supplying the high frequency powers to the susceptor 11 and the upper electrode 33 from the high frequency power supplies 18 and 52, respectively. Thus, as shown in FIG. 3B, the CF-based deposit 50 is deposited on the facing surface 33a of the upper electrode 33 by the plasma of the processing gas. At the same time, Ar ions in the plasma are accelerated and collide with a region of the facing surface 33a which is not covered by the CF-based deposit 50. As a result, the facing surface 33a of the upper electrode 33 is roughened. In the example shown in FIG. 3B, recesses and protrusions are formed by roughening the facing surface 33a of the upper electrode 33.

Preferably, the CPU 53 executes the first step, i.e., the step S102, under the following condition.
<Condition for First Step>
Pressure in processing chamber: 10 to 50 mT
High frequency power to upper electrode: 50 to 550 W
High frequency power to lower electrode: 600 to 1300 W
Frequency of high frequency power to upper electrode: 60 MHz
Frequency of high frequency power to lower electrode: 13.56 MHz
Processing gases and flow rates: $C_4F_6$/$O_2$/Ar=2-20/2-20/200-2000 sccm
Processing time: 5 to 180 sec Subsequently, the CPU 53 executes the second step of removing a part of the CF-based deposit from the facing surface 33a of the upper electrode 33 by using a plasma of a processing gas containing $O_2$ gas by supplying the high frequency power to the upper electrode 33 only (step S103).

The second step will be described in detail hereinafter. The CPU 53 executes a supply of a processing gas containing $O_2$ gas into the processing chamber 10 from the processing gas supply unit 70. Further, the CPU 53 executes a generation of a plasma of $O_2$ gas by supplying the high frequency power from the high frequency power supply 52 to the upper electrode 33. At this time, the CPU 53 does not execute a supply of the high frequency power from the high frequency power supply 18 to the susceptor 11. Accordingly, as shown in FIG. 3C, a part of the CF-based deposit 50 deposited on the facing surface 33a of the upper electrode 33 reacts with oxygen radicals or oxygen ions in the plasma to be removed from the facing surface 33a of the upper electrode 33. In the example shown in FIG. 3C, a part of the CF-based deposit 50 on the protrusions formed by roughening the facing surface 33a reacts with oxygen radicals or oxygen ions in the plasma to be removed.

Preferably, the CPU 53 executes the second step, i.e., the step S103 under the following condition.
<Condition for Second Step>
Pressure in processing chamber: 50 to 150 mT
High frequency power to upper electrode: 300 to 2000 W
High frequency power to lower electrode: 0 W
Frequency of high frequency power to upper electrode: 60 MHz
Frequency of high frequency power to lower electrode: 13.56 MHz
Processing gas and flow rate: $O_2$=50 to 600 sccm
Processing time: 5 to 60 sec Next, the CPU 53 executes the third step of removing the CF-based deposit remaining on the facing surface 33a of the upper electrode 33 by using a plasma of a processing gas containing $O_2$ gas by respectively supplying the high frequency powers to the susceptor 11 and the upper electrode 33 (step S104).

The third step will be described in detail hereinafter. The CPU 53 executes a supply of a processing gas containing $O_2$ gas from the processing gas supply unit 70 into the processing chamber 10. Further, the CPU 53 executes a generation of a plasma of the processing gas containing $O_2$ gas by supplying the high frequency powers from the high frequency power supplies 18 and 52 to the susceptor 11 and the upper electrode 33, respectively. Accordingly, as shown in 3D, the CF-based deposit 50 remaining on the facing surface 33a reacts with oxygen radicals or oxygen ions in the plasma and the CF-based deposit 50 is completely removed from the facing surface 33a of the upper electrode 33. In the example shown in FIG. 3D, the CF-based deposit 50 on the recesses and the protrusions formed by roughening the facing surface 33a reacts with oxygen radicals or oxygen ions in the plasma, and the CF-based deposit 50 on the recesses and the protrusions is completely removed.

In other words, when the high frequency powers are supplied to both of the susceptor 11 and the upper electrode 33, the generation of oxygen radicals or oxygen ions in the plasma is promoted compared to when the high frequency power is supplied to the upper electrode 33 only. Thus, the oxygen radicals or the oxygen ions reach the recesses as well as the protrusions. As a result, the CF-based deposit 50 on the recesses and the protrusions is completely removed.

Preferably, the CPU 53 executes the third step, i.e., the step S104 under the following condition.

<Condition for Third Step>
Pressure in processing chamber: 50 to 150 mT
High frequency power to upper electrode: 300 to 2000 W
High frequency power to lower electrode: 5 to 150 W
Frequency of high frequency power to upper electrode: 60 MHz
Frequency of high frequency power to lower electrode: 13.56 MHz
Processing gas and flow rate: $O_2$=50 to 600 sccm
Processing time: 60 to 300 sec Next, the CPU 53 returns the process to the step S102 when the number of repetition of the first, second and third steps does not reach a predetermined number (NO in step S105), and then repeats the first, second and third steps. In other words, the CPU 53 executes a control step to perform the multiple repetition of the first, second and third steps. This repetition is performed 100 times or more, preferably 200 times or more, and more preferably 280 times or more.

On the other hand, when the number of repetition of the first, second and third steps reaches the predetermined number (YES in step S105), the CPU 53 terminates the entire process.

Figure 4:
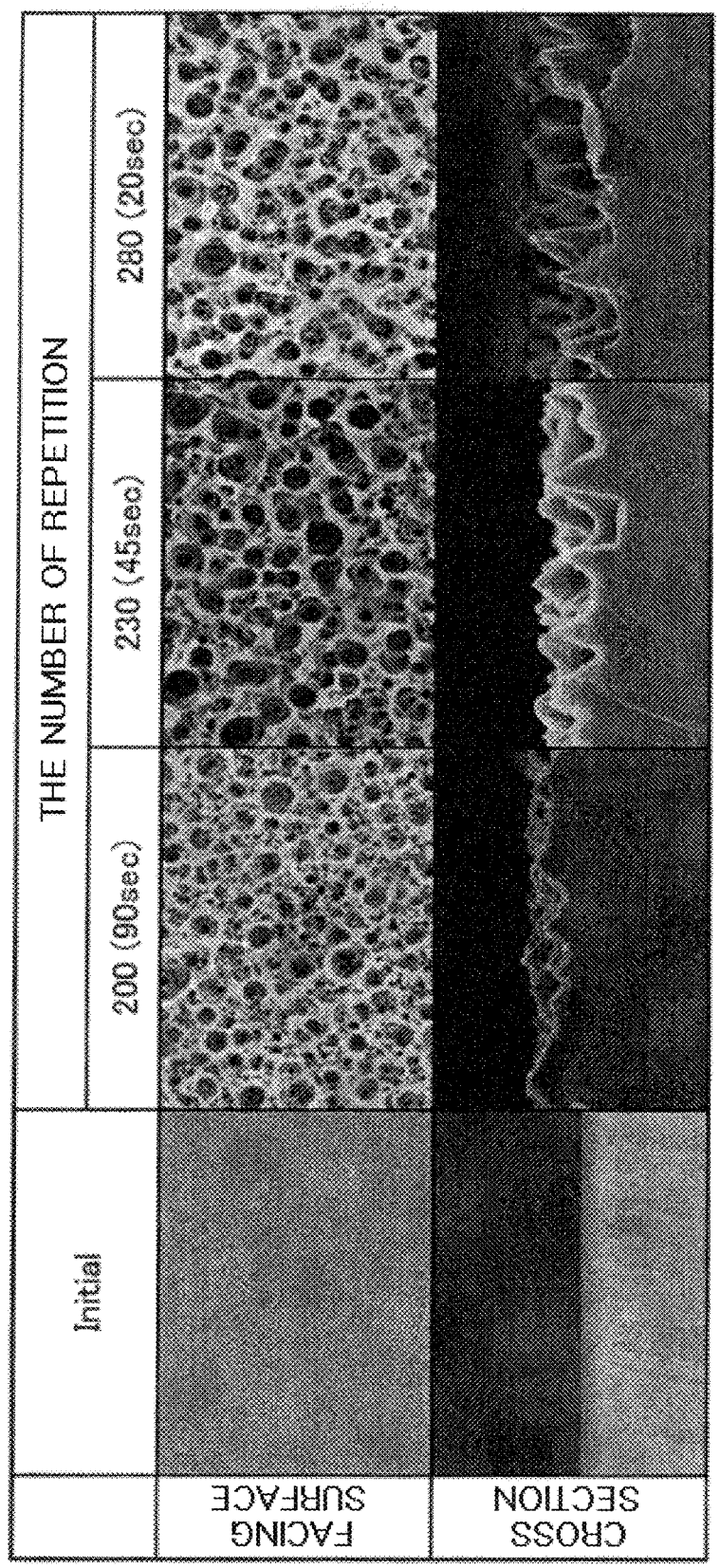
FIG. 4 shows an example of a surface state of the upper electrode in a case of repeating first, second and third steps multiple times.

Hereinafter, there will be described a test result after the first, second and third steps are repeated multiple times. FIG. 4 shows an example of a surface state of the upper electrode in the case of repeating the first, second and third steps multiple times. FIG. 4 shows enlarged images of the facing surface 33*a* and the cross section of the upper electrode 33 (electrode plate 35) before and after the process. In FIG. 4, "Initial" shows the upper electrode 33 (electrode plate 35) before the process; "200 (90 sec)" in "the number of repetition" shows the upper electrode 33 (electrode plate 35) after the repetition of the first step (processing time: 90 sec), the second step and the third step was performed 200 times; "230 (45 sec)" in "the number of repetition" shows the upper electrode 33 (electrode plate 35) after the repetition of the first step (processing time: 45 sec), the second step and the third step was performed 230 times; and "280 (20 sec)" in "the number of repetition" shows the upper electrode 33 (electrode plate 35) after the repetition of the first step (processing time: 20 sec), the second step and the third step was performed 280 times.

Referring to the test result shown in FIG. 4, the surface roughness of the facing surface 33*a* of the upper electrode 33 was increased as the number of repetition of the first, second and third steps was increased. The surface roughness of the facing surface 33*a* of the upper electrode 33 after the repetition of the first, second and third steps was performed 200 times was substantially equal to that of the facing surface 33*a* of a used upper electrode 33. In other words, the surface roughness was influenced by the processing time of the first step. The surface roughness of Ra 0.1 μm or more is preferable and the surface roughness of Ra 0.3 μm or more is more preferable. Preferably, the surface roughness of the upper electrode is increased radially from the center to the edge of the electrode surface. More preferably, the surface roughness is higher at the outer peripheral portion than at the central portion. The surface roughness of the upper electrode preferably has an irregular shape such as that of a pumice stone.

Therefore, it is preferable to execute the first, second and third steps under the following condition.

Figure 5:
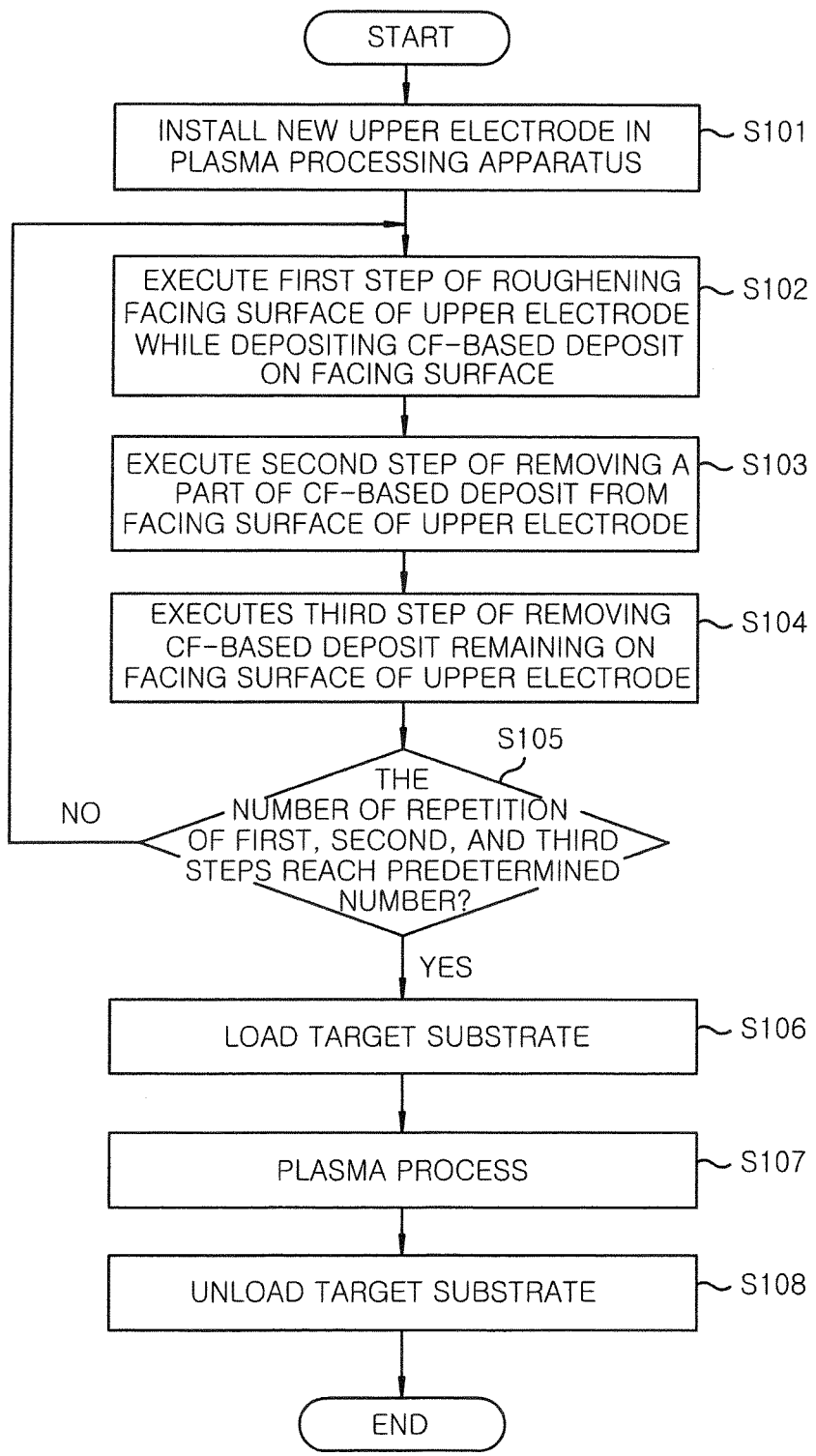
FIG. 5 is a flowchart showing an example of a plasma processing method according to an embodiment.

<Condition for First Step>
Pressure in processing chamber: 10 to 50 mT
High frequency power to upper electrode: 100 to 300 W
High frequency power to lower electrode: 700 to 900 W
Frequency of high frequency power to upper electrode: 60 MHz
Frequency of high frequency power to lower electrode: 13.56 MHz
Processing gas and flow rate: $C_4F_6/O_2/Ar$=5-10/5-10/500-1200 sccm
Processing time: 20 to 90 sec <Condition for Second Step>
Pressure in processing chamber: 50 to 150 mT
High frequency power to upper electrode: 500 to 1000 W
High frequency power to lower electrode: 0 W
Frequency of high frequency power to upper electrode: 60 MHz
Frequency of high frequency power to lower electrode: 13.56 MHz
Processing gas and flow rate: $O_2$=100 to 300 sccm
Processing time: 10 to 30 sec <Condition for Third Step>
Pressure in processing chamber: 50 to 150 mT
High frequency power to upper electrode: 500 to 1000 W
High frequency power to lower electrode: 10 to 50 W
Frequency of high frequency power to upper electrode: 60 MHz
Frequency of high frequency power to lower electrode: 13.56 MHz
Processing gas and flow rate: $O_2$=100 to 300 sccm
Processing time: 80 to 160 sec Hereinafter, there will be described a plasma processing method performed by the plasma processing apparatus 1 according to the embodiment. FIG. 5 is a flowchart showing an example of the plasma processing method according to the embodiment. Steps S101 to S105 in FIG. 5 correspond to the steps S101 to S105 in FIG. 2. Therefore, redundant description thereof will be omitted.

As shown in FIG. 5, when the number of repetition of the first, second and third steps reaches a predetermined number (YES in step S105), the CPU 53 executes a loading of the target substrate to be processed into the processing chamber 10 (step S106).

Then, the CPU 53 executes a plasma process using a plasma of a predetermined processing gas on the target substrate by supplying a high frequency power to at least one of the upper electrode 33 and the susceptor 11 (step S107).

Next, the CPU 53 executes an unloading of the target substrate from the processing chamber 10 (step S108) and terminates the entire processing.

Figure 6:
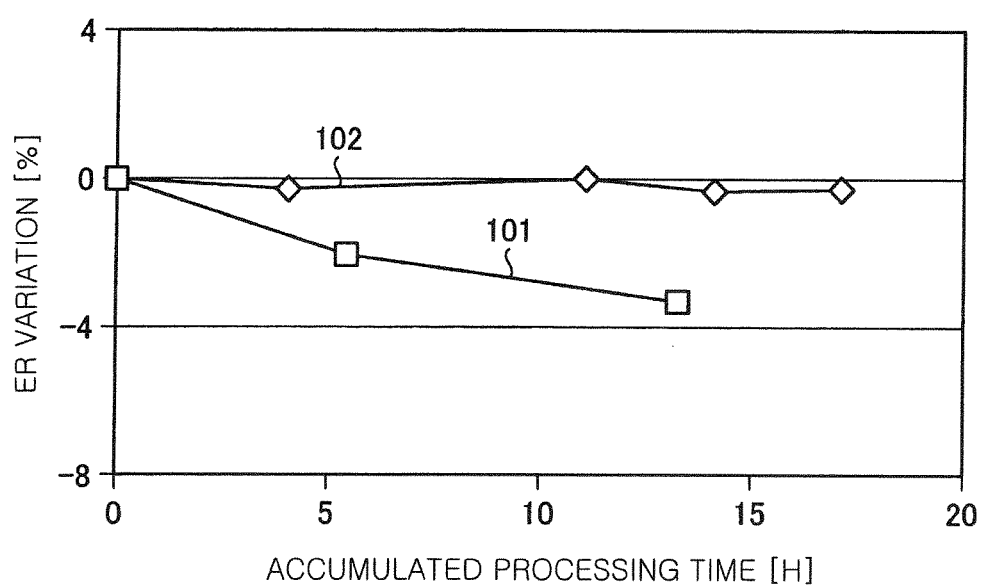
FIG. 6 shows a relationship between an etching rate variation and an accumulated processing time of a plasma etching process.

FIG. 6 shows a relationship between an etching rate variation and an accumulated processing time of a plasma etching process. In FIG. 6, the horizontal axis represents the accumulated processing time (Hour) of the plasma etching process and the vertical axis represents the etching rate variation (%). Further, in FIG. 6, a graph 101 shows the etching rate variation in the case of using a new upper electrode and a graph 102 shows the etching rate variation in the case of using the upper electrode 33 obtained by performing the surface treatment according to the embodiment on the new upper electrode.

As shown in FIG. 6, the etching rate variation was suppressed in the case of using the upper electrode 33 obtained by performing the surface treatment according to the embodiment on a new upper electrode, compared to the case of using the new upper electrode.

The plasma processing apparatus 1 according to the embodiment is configured to roughen the facing surface of the upper electrode 33 while depositing the CF-based deposit on the facing surface by performing the first step and remove the CF-based deposit by performing the second and the third step. Then, the plasma processing apparatus 1 repeats the first, second and third steps multiple times. As a result, the surface of the upper electrode 33 is roughened without detaching the upper electrode 33 from the plasma processing apparatus 1, which makes it possible to improve the operation efficiency of the plasma processing apparatus 1.

Further, the upper electrode 33 obtained by performing the surface treatment according to the embodiment on a new upper electrode can suppress the etching rate variation.

While the disclosure has been shown and described with respect to the embodiments, it will be understood by those skilled in the art that various changes and modifications may be made without departing from the scope of the disclosure as defined in the following claims.

What is claimed is:

1. A method for surface treatment of an upper electrode, comprising:
   a first step of roughening a facing surface of the upper electrode, which faces a lower electrode, while depositing a CF-based deposit on the facing surface by using a plasma of a processing gas containing a CF-based gas, $O_2$ gas and Ar gas by respectively supplying a first and a second high frequency power to the lower electrode and the upper electrode;
   a second step of removing a part of the CF-based deposit from the facing surface by using a plasma of a processing gas containing $O_2$ gas by supplying the second high frequency power to the upper electrode only; and
   a third step of removing the CF-based deposit remaining in the second step from the facing surface by using a plasma of a processing gas containing $O_2$ gas by respectively supplying the first and the second high frequency power to the lower electrode and the upper electrode,
   wherein the first, second and third steps are repeated multiple times.

2. The method of claim 1, wherein the CF-based gas is $C_4F_6$ gas.

3. The method of claim 1, wherein the third step is executed in a state where the first high frequency power supplied to the lower electrode is smaller than the second high frequency power supplied to the upper electrode.

4. The method of claim 1, wherein a processing time of the first step is in a range from 5 sec to 180 sec.

5. The method of claim 1, wherein a frequency of the second high frequency power supplied to the upper electrode is higher than a frequency of the first high frequency power supplied to the lower electrode.

6. The method of claim 1, wherein the first, second and third steps are repeated 100 times or more.

7. The method of claim 1, wherein the upper electrode is a new one installed in a plasma processing apparatus.

8. A plasma processing apparatus comprising:
   a processing chamber;
   a processing gas supply unit comprising a source of a CF-based gas, $O_2$ gas and Ar gas and configured to supply the processing gas into the processing chamber;
   a lower electrode provided in the processing chamber and configured to mount thereon a target object to be processed;
   an upper electrode provided in the processing chamber to face the lower electrode; and
   a control unit configured to execute a first step roughening a facing surface of the upper electrode, which faces the lower electrode, while depositing a CF-based deposit on the facing surface by using a plasma of processing gas containing the CF-based gas, $O_2$ gas and Ar gas by respectively supplying a first and a second high frequency power to the lower electrode and the upper electrode; a second step of removing a part of the CF-based deposit from the facing surface by using a plasma of processing gas containing $O_2$ gas by supplying the second high frequency power to the upper electrode only; and a third step of removing the CF-based deposit remaining in the second step from the facing surface by using a plasma of processing gas containing $O_2$ gas by respectively supplying the first and the second high frequency power to the lower electrode and the upper electrode, wherein the first, second and third steps are repeated multiple times.

* * * * *